United States Patent [19]
Valeri et al.

[11] Patent Number: 4,746,960
[45] Date of Patent: May 24, 1988

[54] VERTICAL DEPLETION-MODE J-MOSFET

[75] Inventors: Stephen J. Valeri, Warren; Bernard A. MacIver, Lathrup Village; Kailash C. Jain, Sterling Heights, all of Mich.

[73] Assignee: General Motors Corporation, Detroit, Mich.

[21] Appl. No.: 77,742

[22] Filed: Jul. 27, 1987

[51] Int. Cl.⁴ .................. H01L 29/78; H01L 29/80
[52] U.S. Cl. ................... 357/23.7; 357/23.4; 357/22
[58] Field of Search .............. 357/22 E, 23.4, 23.7

[56] References Cited

U.S. PATENT DOCUMENTS 4,181,542  1/1980  Yoshida et al. ............... 357/22 E
4,611,220  9/1986  MacIver ........................ 357/23.7

Primary Examiner—Eugene R. Laroche
Assistant Examiner—Michael B. Shingleton
Attorney, Agent, or Firm—Robert J. Wallace

[57] ABSTRACT

A vertical j-MOSFET useful as a power transistor includes a two-dimensional array of square cells in which a small fraction of the cells are replaced by a double-junction sink useful for collecting the minority carriers in the channel regions that normally will accumulate at each interface of the gate electrode and channel region.

9 Claims, 2 Drawing Sheets

VERTICAL DEPLETION-MODE J-MOSFET

FIELD OF THE INVENTION

This invention relates to a vertical metal-oxide semiconductor (MOS) transistor.

BACKGROUND OF THE INVENTION

Vertical MOS transistors have recently become of particular interest for use as power transistors because their design permits efficient use of chip area. In such transistors, the source/drain is positioned at one surface of the substrate and the drain/source is provided by the bulk of the substrate and current passes vertically through the substrate. In the most common, or enhancement-mode form, such a transistor is normally off but is turned on by applying an appropriate voltage to the gate electrode of the transistor. The electric field of the applied voltage creates a conducting channel by forming an inversion layer between the source and drain.

In the less common depletion-mode form, the transistor is normally on, and one achieves current control by using a voltage applied to the gate electrode to deplete the normally conducting channel between the source and drain of its majority charge carriers to increase its resistance to the flow of current therethrough.

In U.S. Pat. No. 4,611,220 which issued on Sept. 6, 1986, there is described a novel form of MOS transistor of the depletion mode type, that features a small island of opposite conductivity type located in the normally conducting channel at the gate-insulator interface and maintained essentially at the potential of the gate electrode. The island serves as a sink to collect those minority charge carriers in the channel that are attracted to the interface when a voltage is applied to the gate electrode to deplete the channel. If left uncollected, they would serve to shield the channel from the applied electric field, making complete depletion of the channel difficult. Such incomplete depletion makes it difficult to turn the transistor completely off, thereby affecting adversely its operation. The novel transistor is there described as a junction-MOS field effect transistor (j-MOSFET). Moreover, there is also described a vertical form of j-MOSFET that uses a buried-oxide layer to control the path of current flow to achieve vertical operation. Vertical forms of MOSFETs are designed for high power since this geometry facilitates the paralleling of a plurality of channel regions between the source and drain contacts. In this transistor, a junction for collecting the minority charge carriers was included in each separate channel region. This results in a relatively complex structure.

SUMMARY OF THE INVENTION

A vertical j-MOSFET in accordance with the invention uses a semiconductive chip that includes a patterned buried oxide layer which divides the chip into a first front portion and a second back or substrate portion. The flow between the two portions of the chip is by way of openings in the buried oxide layer. The front surface includes a first segmented current-carrying electrode, the segments basically arranged to form a regular two-dimensional cell array, and the back surface of the chip includes the second current-carrying electrode. The two electrodes correspond to the source and drain of the transistor and which is which depends on the polarity of the voltage applied between them. The front portion of the chip includes the transistor channel segmented into a plurality of sections, one for each cell and each controlled by a separate gate electrode segment. The regularity of the two-dimensional rectangular array on the front surface of the chip is modified by the substitution, at various regions of the array, of a large sink for the minority charge carriers that tend to collect under the gate electrode when the channel is being depleted of majority charge carriers.

Viewed more broadly, the invention is a vertical j-MOSFET which includes a large number of cells, typically hundreds, connected in parallel between a common source electrode and a common drain electrode. The two electrodes are on opposite surfaces of a semiconductive chip that includes an apertured buried oxide layer which is useful to divide a common channel layer into a plurality of interconnected channel regions, each controlled by a segment of a common gate electrode. The cells form a periodic two-dimensional array except that a small fraction of sites of the array are occupied instead by sinks capable of collecting the minority charge carriers that tend to build up at each interface of a gate electrode segment with the channel when the gate electrode is biased to deplete the channel of majority charge carriers. By collecting such minority charge carriers in the sinks, the shielding effect of these carriers is eliminated and the channel is more readily depleted of the majority charge carriers during the depletion phase of the transistor's operation.

The invention will be better understood from the subsequent more detailed description taken conjunction with the accompanying drawings.

It is to be noted that the drawings are not to scale since the vertical dimensions are generally much smaller than the horizontal dimensions.

DETAILED DESCRIPTION OF AN ILLUSTRATIVE EMBODIMENT

Figure 1:
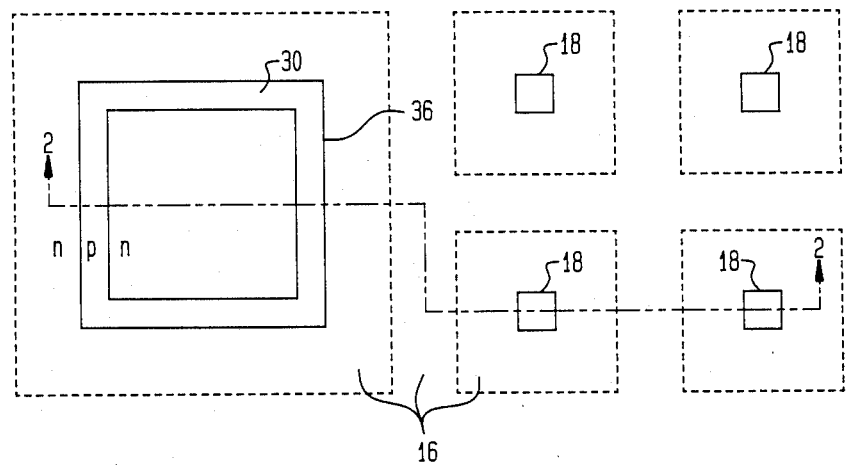
FIG. 1 is a plan view of a small portion of a semiconductive chip which houses a j-MOSFET in accordance with the invention.
Figure 2:
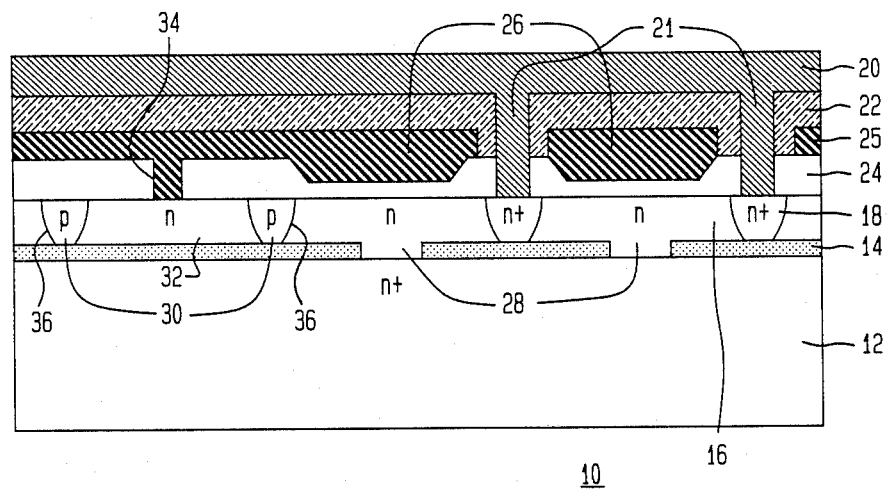
FIG. 2 shows a section taken along the line 2—2 of FIG. 1.

With reference now to the drawing, FIGS. 1 and 2 depict a limited portion of a silicon chip which includes on the right side a pair of cells of conventional form of a thin-film vertical depletion-mode MOSFET and on the left side a double junction sink connected to the channel region of the vertical MOSFET that distinguishes the transistor as a j-MOSFET, as the term is used herein.

The silicon chip 10 includes an N+ type bulk or substrate portion 12 which serves as either the source or drain of the transistor depending on the polarities applied. For present discussion purposes, it will be termed the source. Overlying the substrate 12 is the patterned silicon oxide layer 14 provided with openings 28 to permit current flow between the substrate and the overlying N-type layer 16 that provides the channel portions of the transistor. The N-type layer 16 includes the N+ type regions 18 which serve, in the mode being described, as the drain regions of the transistor, although in the reversed mode they would serve as the source regions. The overlying metal layer 20, typically of aluminum, includes projections 21 which pass through openings in the passivating P-type glass 22 and in the gate oxide 24 to make low resistance electrical connection to the source regions 18. The polysilicon layer 25 is segmented to provide gate electrodes 26 that lie over essentially the entire length of each channel region of N-type layer 16 between the drain regions 18. Openings 28 in the buried oxide are centered under the gate electrodes and permit current flowing in the channel regions to pass through to the substrate portion 12.

In the absence of a gate voltage and with source 12 biased positively with respect to drain 18, electron current flows from the drain 18 laterally in the N-type channel 16 and then vertically through the openings 28 to the source 12.

The application of a suitably negative voltage to the gate electrode 26 causes the depletion of electron charge carriers in the underlying channel region and, accordingly, the current flow between source and drain is impeded in the manner characteristic of a depletion-mode MOSFET. Moreover the increase in hole carrier concentration in the channel as the result of their attraction to the negatively biased gate electrode tends to shield the channel from the effect of the electric field created by the gate electrode so that it becomes very difficult to deplete the channel completely of electrons, particularly if the channel is initially relatively deep, as is typical of a power transistor to insure adequate current-handling capacity in its conducting state.

To alleviate this problem, in the manner characteristic of a j-MOSFET, a sink needs to be provided in the channel to collect these holes.

To this end, as shown in the left side of the figures, the channel region is interrupted by the annular P-type region 30, seen in FIG. 1 as essentially a square annulus, which extends completely through the N-type layer 16, for enclosing an N-type region 32. A projection 34 from the polysilicon layer 25, which forms the gate electrode segment 26 in the right side of the figure, contacts the N-type region 32 so that it is always maintained at the gate electrode voltage. Now when the gate electrode 26 by way of the layer 25 is put at a negative voltage to cause depletion of electrons in the channel regions of the transistor, the P-type annular zone 30 also assumes a negative voltage and the outer P-N junction 36 it forms with the N-type channel becomes reverse-biased and serves as a sink for collecting the holes drawn to the channel by the negative voltage on the layer 25. The collection of holes by the sink 30 will alleviate the build-up of holes in the channel regions of the transistor portion of the chip. In particular, it appears that the annular ring 30 can alleviate the build-up problem over an area of the channel considerably larger than its own immediate area. The invention makes use of this factor.

Alternatively, it is feasible simply to connect the projection 34, to a square P-type sink region, omitting the inner N-type region 32. The presence of region 32 however permits the combined regions 30, 32 to serve a dual role, not only to assist in the depletion of the channel as described, but also to assist in enhancement of the channel if desired, as is done by the gate electrode in a conventional enhancement-mode MOSFET. In particular, by the application of a positive voltage on the gate electrode by way of the layer 25 and so on the N-type region 32, an accumulation layer of electrons may be induced at the channel-gate interface to improve the conductance of the channel so that there will be an increase in current between the source and drain regions for a given source/drain voltage. The presence of N-type region 32 insures that the application of a positive voltage on the gate electrode will not unduly increase the gate current since it introduces a blocking p-N junction.

As indicated above, an important characteristic on which the invention depends is that the role of the P-type region 30 as a sink for holes in the channel can be extended over a wide area of the array.

Figure 3:
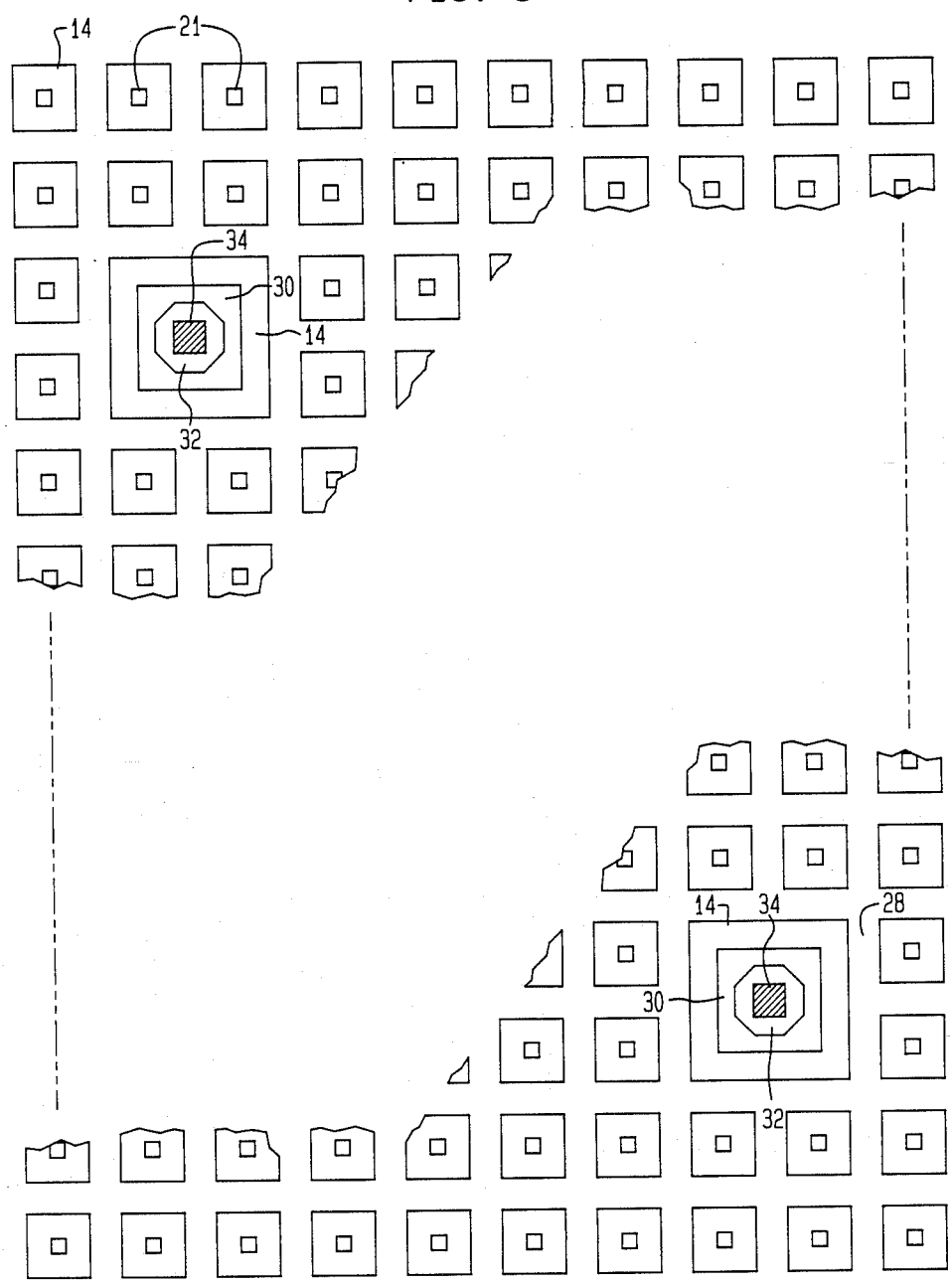
FIG. 3 is a schematic plan view of a larger portion of the chip illustrating the inclusion of two sinks spaced apart in the otherwise regular array of conducting cells.

It is to be noted that the channel regions are not isolated and discrete but rather are continuous and interconnected in matrix-like fashion. As seen in the plan view of FIG. 1, the channel regions form a continuous layer over most of the front portion of the chip, excluding only drain regions and the regions enclosed by the annular P-type regions 30. The area of influence of the reverse-biased P-N junction 36 for collecting the holes in the channel depends on the magnitude of the voltage difference between the drain and gate electrodes, being the wider the greater the difference. For operation at higher temperatures where more minority carriers are being generated, it is desirable to decrease the spacing of the sinks to improve collection of the increased number of generated carriers. Other factors are the resistivity of the channel material and the thickness of the channel. For typical designs, the influence of a reversed bias P-N junction can extend in each direction at least several channel regions. This makes it feasible to use only a limited number of sinks and only a small fraction of the number of cell sites in the array. As seen in FIG. 3, which shows a larger portion of the chip, two separate sinks are spaced apart in both the X- and Y-directions many sections. A power transistor, which typically might include a 50 by 50 array of separate sites for forming 2500 potential gain sections in a square chip 2 mils on a side, might also include as few as four or as many as twenty five sink regions of the kind described interspersed in the array as depicted in FIG. 3.

As shown in FIG. 3, a sink region has an area of about four sites or gain sections. The wider separation possible thereby between the two P-N junctions of the annulus of the sink increases the voltage breakdown threshold and reduces the parasitic capacitance of the junctions.

It can be appreciated that the particular square geometry of each cell shown has considerable advantage for manufacturing simplicity. The use of a two-dimensional array of square cells cooperates constructively with the square sink geometry depicted to facilitate easy placement of the sink structure where deemed desirable.

The fabrication of the transistor depicted can be relatively straightforward and is within the skill of the worker in the art. An illustrative process is described in the earlier mentioned patent. In this process, there is first prepared a wafer of suitable monocrystalline silicon and the wafer is then implanted through a mask with oxygen to form the patterned silicon oxide layer 14 buried in its interior as shown in FIG. 2. Any damage to the wafer crystal can be annealed out by suitable heating, which also is useful in removing any oxygen implanted shallowly in the region intended to serve as the channel. If desired, after the oxygen implantation step, the thickness of the overlying silicon can be increased by epitaxial growth of a high resistivity layer. After formation of the buried oxide layer, the wafer can then be treated in a straightforward fashion to complete the j-MOSFET depicted.

Alternatively, to form the desired buried oxide layer structure needed, there is prepared a monocrystalline silicon wafer of appropriate high resistivity for the channel portion. Then the surface of the wafer is oxidized in the usual fashion to form an oxide layer of thickness useful to serve as the buried oxide layer 14 of FIG. 2. A thickness of several hundred Angstroms should be adequate. This oxide layer is patterned in the usual fashion to expose the underlying monocrystalline silicon at the regions corresponding to the openings 28 shown in FIG. 2. Then a layer of relatively low resistivity silicon is deposited by chemical-vapor deposition over the patterned oxide-covered silicon wafer; advantageously the silicon is deposited epitaxially on the substrate, the silicon exposed at the openings serving as the seeds. However, in the event that the crystallinity is not of suitable quality, known laser melting and freezing techniques can be used to improve the crystalline nature of this layer.

This layer will serve as the low resistivity substrate 12 or source portion of the chip in the mode described, so that relatively low quality crystallinity is tolerable. It also should be of a thickness adequate to provide mechanical strength to the chip since now the chip is inverted and the original layer of high resistivity silicon thinned to a thickness suitable for use as the channel region 16 of the transistor.

Other techniques which may be available for forming the desired buried oxide layer structure similarly should be suitable.

After preparation of the desired buried oxide layer silicon wafer with an overlying high resistivity surface layer 16, portions of the high resistivity layer can be diffused with the appropriate impurities in the usual fashion to form the N+ type regions 18 and the P-type regions 30. Such methods might involve either vapor-solid diffusion or ion implantation followed by a drive-in diffusion.

This would be followed by formation of the gate oxide layer 24, typically several hundred Angstroms thick. This in turn would be appropriately apertured to accommodate the polysilicon projections 34 which need to contact the N-type channel layer 16 at appropriate locations and then a polysilicon layer 25 appropriately doped to be of low resistivity could be deposited over the oxide layer, extending through the openings in the oxide layer to form the projections 34. It may also prove desirable to thin the oxide at regions where the gate electrodes 26 are to be formed.

Next the passivating glass layer 22 is deposited over the resulting structure. This is patterned to provide openings for passage therethrough of the connections 21 to the drain regions 18. Moreover, the oxide layer 24 needs similarly to be patterned. Then the metal layer 20 is deposited, typically by evaporation of aluminum. The deposited aluminum needs to fill the openings in the glass layer and the oxide layer to form the drain contact projections 21. In some instances, it may be desirable first to fill the openings selectively with a metal to planarize the surface and then to follow with a deposition of the chosen metal to form the layer 20 in known fashion.

The particular dimensions of the various regions would be chosen in light of the particular design characteristics desired in accordance with principles well understood. Moreover, it should be apparent that while the square shape of individual cells is particularly advantageous, other shapes which simplify the fabrication and lend themselves to large periodic two dimensional arrays may be substituted for example, rectangular. It is obvious that the complementary structure is also feasible.

The embodiments of the invention in which an exclusive property or privilege is claimed are defined as follows:

1. A vertical j-MOSFET transistor comprising a plurality of cells connected in parallel between a common drain electrode and a common source electrode, the cells being aligned in a two-dimensional regular array except at localized sites spaced apart in the array, and means at each such site for serving as a sink and for collecting minority charge carriers which tend to build up at each interface of a channel region and gate electrode of the transistor when a voltage is applied to the gate electrode for depleting the channel region of majority charge carriers.

2. The vertical transistor of claim 1 in which the means for serving as a sink include an inner zone of the conductivity type of the channel regions that is surrounded by an annular zone of the conductivity type opposite that of the channel region.

3. The vertical transistor of claim 1 in which each means for serving as a sink occupies a plurality of the array sites.

4. The vertical transistor of claim 1 in which each cell is square and occupies a unit area in the array and each means for serving as a sink is square and occupies four unit areas in the array.

5. The vertical transistor of claim 4 in which each means for serving as a sink includes an inner zone of the conductivity type of the channel regions and is surrounded by an annular zone of the conductivity type opposite that of the channel, and means are included for maintaining the inner zone at the voltage of the gate electrode.

6. The vertical transistor of claim 1 which further includes a buried oxide layer which is apertured and which divides the channel between the source and drain electrodes into a plurality of segments and the gate electrode of the transistor includes a plurality of segments.

7. A vertical j-MOSFET which comprises a semiconductor chip which includes a patterned buried insulator layer which divides the chip into a front portion and a back portion and a plurality of channel portions extending between the front and back portions through openings in the buried insulator layer, a gate electrode on said front surface and insulated therefrom, and divided into a plurality of segments for controlling the channel portions, the outer surface of the front portion including a segmented first current-carrying electrode and the outer surface of the back portion including a second current-carrying electrode, and means for collecting minority charge carriers that tend to build up at the interface of each channel portion with its segment of the gate electrode, characterized in that:

the chip is divided into a plurality of sites by the first current-carrying electrode, the patterned insulator layer, and the segmented gate electrode, the sites being arranged in a periodic two-dimensional array, a majority of the sites being occupied by cells formed by the segments of first current-carrying electrode and their associated current paths, and a minority of the sites being occupied by the means for serving as sinks.

8. The transistor of claim 7 in which each cell is square and occupies a unit site and the means for serving as a sink occupies a plurality of unit sites.

9. The transistor of claim 8 in which the means for serving as a sink includes an inner zone of the conductivity type of the channel portions and a surrounding outer zone of the conductivity type opposite that of the channel portions.

* * * * *